(12) United States Patent
Kal et al.

(10) Patent No.: US 9,263,678 B2
(45) Date of Patent: Feb. 16, 2016

(54) METHOD FOR MANUFACTURING ORGANIC SOLAR CELL

(75) Inventors: Jin Ha Kal, Seoul (KR); Jung Seok Han, Seoul (KR); Chul Oh, Seoul (KR); Kwang Su Kim, Suwon-si (KR)

(73) Assignee: KOLON INDUSTRIES, INC., Gwacheon-Si (KR)

( * ) Notice: Subject to any disclaimer, the term of this patent is extended or adjusted under 35 U.S.C. 154(b) by 0 days.

(21) Appl. No.: 14/354,756

(22) PCT Filed: May 31, 2012

(86) PCT No.: PCT/KR2012/004293
§ 371 (c)(1),
(2), (4) Date: Jul. 21, 2014

(87) PCT Pub. No.: WO2013/100279
PCT Pub. Date: Jul. 4, 2013

(65) Prior Publication Data
US 2014/0335642 A1   Nov. 13, 2014

(30) Foreign Application Priority Data
Dec. 28, 2011   (KR) ................. 10-2011-0145261

(51) Int. Cl.
| | |
|---|---|
| H01L 21/00 | (2006.01) |
| H01L 51/00 | (2006.01) |
| H01L 51/42 | (2006.01) |
| B08B 1/02 | (2006.01) |
| B08B 3/04 | (2006.01) |
| B08B 5/04 | (2006.01) |
| B08B 15/04 | (2006.01) |
| H01L 51/56 | (2006.01) |

(52) U.S. Cl.
CPC ............. *H01L 51/0013* (2013.01); *B08B 1/02* (2013.01); *B08B 3/041* (2013.01); *B08B 5/043* (2013.01); *B08B 15/04* (2013.01); *H01L 51/0014* (2013.01); *H01L 51/0019* (2013.01); *H01L 51/42* (2013.01); *H01L 51/56* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2005/0009227 A1* | 1/2005 | Xiao et al. | ...................... 438/82 |
| 2007/0095366 A1* | 5/2007 | Verhaverbeke | ................. 134/26 |

(Continued)

FOREIGN PATENT DOCUMENTS

| | | |
|---|---|---|
| JP | 2003-303981 A | 10/2003 |
| JP | 2011-040336 A | 2/2011 |

OTHER PUBLICATIONS

Upscaling of polymer solar cell fabrication using full roll-to-roll processing by Krebs et al., May 2010.*

*Primary Examiner* — Evren Seven
(74) *Attorney, Agent, or Firm* — Birch, Stewart, Kolasch & Birch, LLP

(57) ABSTRACT

A method of manufacturing an organic solar cell is provided. According to the exemplary embodiments of the present invention, a laminate section can be easily removed from a substrate by causing a cleaning unit to move up and down above the substrate or to move forward and backward in a reciprocating manner in the width direction of the substrate. Furthermore, when a contact member is detachably connected to the cleaning unit, the contact member that has been contaminated with a laminate material can be separated from the cleaning unit and easily washed. Also, the laminate section can be removed by spraying a solvent through a discharging unit to dissolve the laminate section, and suctioning the laminate section through a suctioning unit. In this case, the laminate section can be easily removed from the substrate by dissolving the laminate section with the solvent.

12 Claims, 3 Drawing Sheets

(56) References Cited

U.S. PATENT DOCUMENTS

| | | | |
|---|---|---|---|
| 2007/0163638 A1* | 7/2007 | Van Duren et al. | 136/262 |
| 2007/0181165 A1* | 8/2007 | Verhaverbeke | 134/40 |
| 2009/0173954 A1* | 7/2009 | Beeson et al. | 257/88 |
| 2010/0261304 A1* | 10/2010 | Chang et al. | 438/72 |
| 2011/0108814 A1* | 5/2011 | Iida et al. | 257/40 |
| 2014/0144509 A1* | 5/2014 | Fadhel et al. | 136/263 |

* cited by examiner

METHOD FOR MANUFACTURING ORGANIC SOLAR CELL

CROSS-REFERENCE TO RELATED APPLICATION

This application is a National Stage of International Application No. PCT/KR2012/004293 filed on May 31, 2012, and claims priority from Korean Patent Application No. 10-2011-0145261 filed in the Korean Intellectual Property Office on Dec. 28, 2011, the entire contents of which are incorporated herein by reference.

BACKGROUND OF THE INVENTION (a) Field of the Invention

The present invention relates to a method of manufacturing an organic solar cell.

(b) Description of the Related Art

An organic solar cell is a solar cell having a structure which utilizes organic semiconductor materials, including conjugated polymers such as poly(para-phenylene vinylene) (PPV) in which double bonds are alternately disposed, photosensitive low molecular weight compounds such as CuPc, perylene and pentacene, and (6,6)-phenyl-C61-butyric acid methyl ester (PCBM). The organic semiconductor materials can be structurally designed and synthesized into a wide variety, so that organic solar cells have a potential for limitless development.

An organic solar cell such as described above basically has a thin-film type structure, and mainly uses indium tin oxide (ITO), which is a transparent electrode, as an anode and a metal electrode such as aluminum (Al) as a cathode. The photoactive layer has a thickness of about 100 nm and has a bulk heterojunction structure in which a hole acceptor and an electron acceptor exist in mixture.

As the hole acceptor, a conjugated polymer having conductivity, such as PPV, is used, and a fullerene is used as the electron acceptor. At this time, in order to collect, without loss, electrons that have been produced by light at an aluminum electrode through the fullerene, the fullerene should be sufficiently mixed into the conjugated polymer. Therefore, a fullerene derivative such as PCBM can be used so that the fullerene may be thoroughly mixed with the conjugated polymer.

When the conjugated polymer absorbs light, the conjugated polymer produces electron-hole pairs (excitons), and the electrons and holes thus produced are collected respectively at the anode and the cathode via the fullerene and the conjugated polymer, respectively.

Organic solar cells such as described above can be produced in large quantities due to their easy processability and low cost, and can be manufactured into thin films by a roll-to-roll process. Therefore, the organic solar cells described above have an advantage that flexible, large-sized electronic elements can be produced.

However, despite the technical and economical advantages mentioned above, there are still difficulties in putting organic solar cells into practical use because of their low efficiency. Therefore, studies to improve efficiency are being actively carried out in the field of organic solar cells. Studies concerning the efficiency of organic solar cells that have been conducted hitherto are focused on the selection of raw materials or the manufacturing processes for the photoactive layer, the electron transport layer and the hole transport layer so as to effectively utilize absorbed light, as well as the morphology, structure and increased crystallinity of the organic thin films for overcoming low charge mobility.

PRIOR ART DOCUMENTS

Patent Documents (Patent Document 1) Korean Patent No. 10-1013155 (Organic solar cell using conductive polymer transparent electrode, and manufacturing method thereof) filed 2011 Feb. 10.

(Patent Document 2) Korean Patent Application Laid-Open No. 10-2011-0002802 (Manufacturing apparatus and manufacturing method of fuel-sensitized solar cell through roll-to-roll continuous processing) filed 2011 Jan. 10.

The above information disclosed in this Background section is only for enhancement of understanding of the background of the invention and therefore it may contain information that does not form the prior art that is already known in this country to a person of ordinary skill in the art.

SUMMARY OF THE INVENTION

An object of the present invention is to provide a technology capable of easily removing a printed layer of unnecessary areas during a printing process of an organic solar cell.

A method for manufacturing an organic solar cell according to an exemplary embodiment of the present invention includes the steps of printing a laminate section constituting an organic solar cell on a substrate that is moved by a conveyor roller; and removing a portion of the laminate section from the substrate by moving a cleaning unit up and down in a reciprocating manner, above the substrate on which the laminate section is printed.

The step of removing the laminate section allows removal of the laminate section from the substrate in the width direction intersecting the direction of movement of the substrate.

At this time, a contact member is detachably connected to an end of the cleaning unit, and the contact member may wipe off the laminate section from the substrate while being brought into contact with the laminate section.

Furthermore, the contact member may be joined to the cleaning unit through a sliding joint along the length direction of the cleaning unit.

Alternatively, the step of removing the laminate section may include the steps of injecting a solvent into the interior of the cleaning unit; causing the cleaning unit to move toward the substrate; and wiping off the laminate section from the substrate by bringing an end of the cleaning unit into contact with the laminate section.

Furthermore, the step of removing a portion of the laminate section may include the steps of bringing the cleaning unit into contact with the laminate section by lowering the cleaning unit toward the substrate; wiping off the laminate section from the substrate by causing the cleaning unit to move in a reciprocating manner longitudinally or transversely in the width direction of the substrate; and lifting the cleaning unit above the substrate.

At this time, when the cleaning unit is brought into contact with the laminate section, the movement of the substrate is stopped, and when the cleaning unit is lifted up, the substrate may be moved by the conveyor roller.

Alternatively, the cleaning unit may have a roll shape that is formed to extent along the width direction of the substrate, and the step of removing a portion of the laminate section may include the steps of bringing the cleaning unit into contact with the laminate section by lowering the cleaning unit toward the substrate; causing the cleaning unit to wipe off the laminate section from the substrate by rotating about the central axis along the length direction of the cleaning unit; and lifting the cleaning unit.

Alternatively, plural auxiliary laminate sections having different components may be printed sequentially on the substrate in the step of printing the laminate section.

A method for manufacturing an organic solar cell according to another exemplary embodiment of the present invention may include the steps of printing a laminate section constituting the organic solar cell on a substrate that is moved by a conveyor roller; spraying a solvent on the laminate section through a discharging unit; and suctioning the laminate section that has been dissolved by the solvent, through a suctioning unit.

At this time, the method may further include, after the step of printing the laminate section, a step of lowering the discharging unit and the suctioning unit toward the substrate, and after the step of suctioning the laminate section, a step of lifting the discharging unit and the suctioning unit away from the substrate.

According to exemplary embodiments of the present invention, the cleaning unit may remove the laminate section from the substrate by moving up and down above the substrate, or by moving forward and backward in a reciprocating manner in the width direction of the substrate. Thereby, the cleaning unit may easily remove the laminate section.

Furthermore, if the contact member is detachably connected to the cleaning unit, the contact member contaminated by the laminate material may be detached from the cleaning unit, and thus may be washed easily.

Furthermore, the laminate section may be removed by spraying a solvent from the discharging unit to dissolve the laminate section, and suctioning the laminate section through the suctioning unit. In this case, the laminate section is dissolved in the solvent, and thereby the laminate section may be easily removed from the substrate.

Also, there is an effect that a portion of the plural auxiliary laminate sections may be selectively dissolved and removed, depending on the nature of the solvent.

DETAILED DESCRIPTION OF THE EMBODIMENTS

Figure 1:
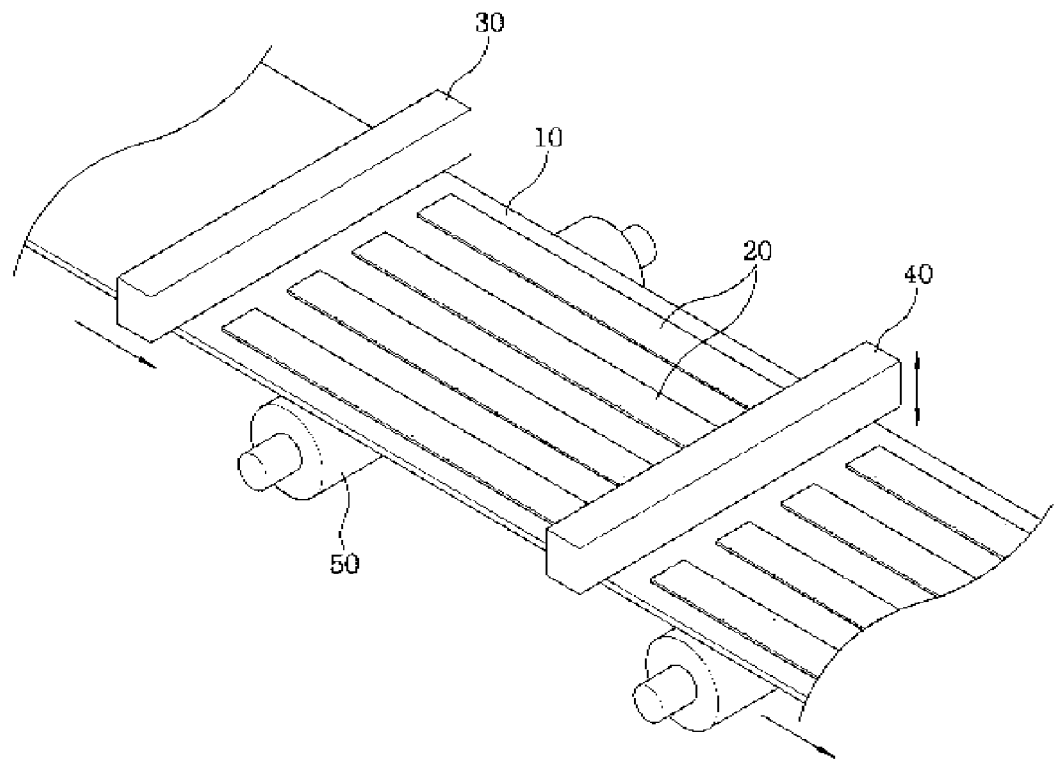
FIG. 1 is a schematic diagram illustrating the method for manufacturing an organic solar cell according to an exemplary embodiment of the present invention.

Hereinafter, exemplary embodiments of the present invention will be described in more detail with reference to the attached drawings, so that those having ordinary skill in the art to which the present invention is pertained can easily carry out the invention. Throughout the specification, identical reference numerals were assigned to similar elements.

Figure 2:
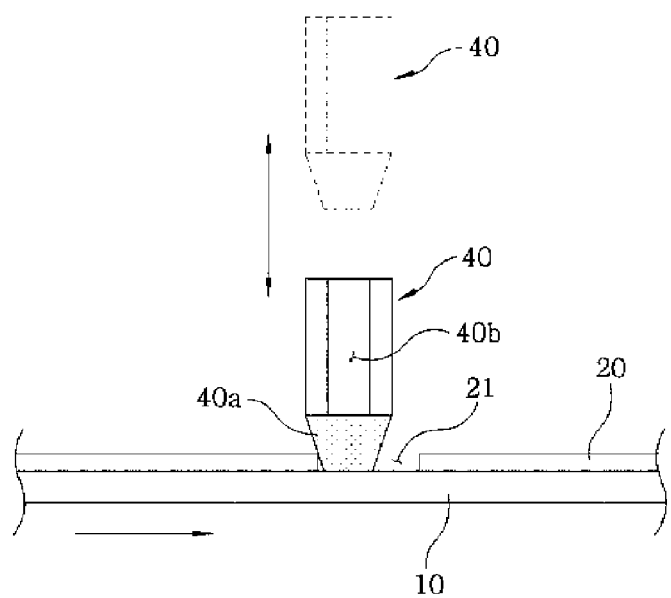
FIG. 2 is a schematic diagram illustrating the step of removing the laminate section.
Figure 3:
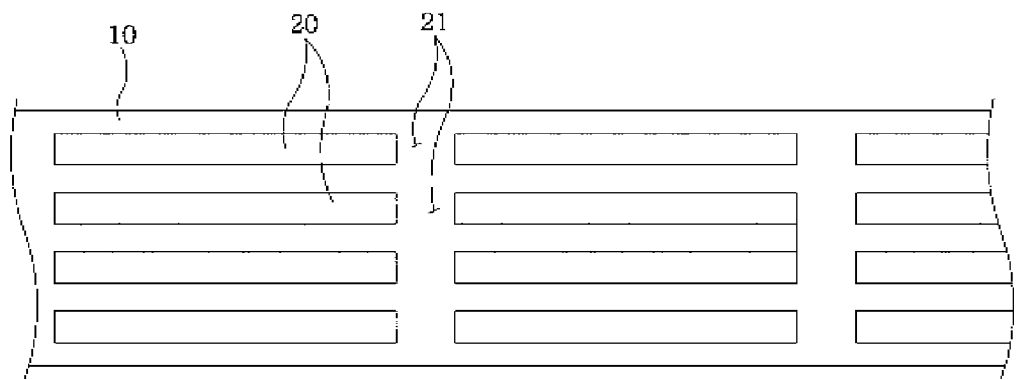
FIG. 3 is a schematic diagram illustrating a substrate from which a portion of the laminate section has been removed.

FIG. 1 is a schematic diagram illustrating the method of manufacturing an organic solar cell according to an exemplary embodiment of the present invention, FIG. 2 is a schematic diagram illustrating the step of removing the laminate section, and FIG. 3 is a schematic diagram illustrating a substrate from which a portion of the laminate section has been removed.

The method for manufacturing an organic solar cell according to an exemplary embodiment of the present invention includes the steps of printing a laminate section constituting the organic solar cell on a substrate that is moved by a conveyor roller; and removing a portion of the laminate section from the substrate by moving a cleaning unit up and down in a reciprocating manner above the substrate on which the laminate section is printed.

The substrate 10 is a member which serves as an external casing of the organic solar cell.

The material of the substrate 10 is not particularly limited, and a transparent inorganic substrate made of quartz or glass, or any one plastic substrate selected from the group consisting of substrates made of polyethylene terephthalate (PET), polyethylene naphthalate (PEN), polycarbonate (PC), polystyrene (PS), polypropylene (PP), polyimide (PI), polyethylene sulfonate (PES), polyoxymethylene (POM), polyether ether ketone (PEEK), polyether sulfone (PES), and polyether imide (PEI), can be used.

In the case of printing the laminate section by a roll-to-roll process, a transparent plastic substrate which is flexible and has high chemical stability, high mechanical strength and high transparency may be used.

The substrate 10 may have a transmittance of at least 70% or higher, and preferably 80% or higher at a visible light wavelength of about 400 nm to 750 nm.

As the substrate 10, an organic transparent electrode such as a graphene thin film, a graphene oxide thin film, or a carbon nanotube thin film; an inorganic-organic composite transparent electrode such as a carbon nanotube thin film coupled with a metal; or the like may be used.

Furthermore, the substrate 10 may be a film in which an electrode is formed by applying a transparent oxide selected from the group consisting of indium tin oxide (ITO), fluorine-doped tin oxide (FTO), $ZnO$—$Ga_2O_3$, $ZnO$—$Al_2O_3$, $SnO_2$—$Sb_2O_3$ and combinations thereof, or a conductive polymer, on a film of polyethylene or the like.

The substrate 10 is conveyed in one direction by a conveyor roller 50. At least one conveyor roller 50 is disposed below the substrate 10, and plural conveyor rollers 50 may be disposed apart from each other depending on the length of the substrate 10 or the moving distance of the substrate 10.

In the step of printing a laminate section 20, a laminate material is applied on the substrate 10 at a printing unit 30, so as to apply the laminate section 20 on the substrate 10.

The laminate material may vary depending on properties of the laminate section 20.

The laminate section 20 is a section that is printed on the substrate 10 to constitute the organic solar cell, and examples thereof include an electrode, a photoactive layer, an electron transport layer, and a metal oxide nano film layer. In addition to the configuration specified above, other layer members constituting the organic solar cell may also be printed.

The electrode printed on the substrate 10 may be a cathode or an anode.

That is, when the organic solar cell is an inverted organic solar cell, a laminate material that can be used as the cathode is applied on the substrate 10, and when the organic solar cell is a general organic solar cell, a laminate material that can be used as the anode is coated on the substrate 10.

Specific examples of the laminate material that forms the cathode 120 include a transparent oxide selected from the group consisting of tin-doped indium oxide (ITO), fluorine-doped tin oxide (FTO), $ZnO\mathrm{-}Ga_2O_3$, $ZnO\mathrm{-}Al_2O_3$, $SnO_2\mathrm{-}Sb_2O_3$ and combinations thereof; an organic transparent electrode such as a conductive polymer, a graphene thin film, a graphene oxide thin film, or a carbon nanotube thin film; and an organic-inorganic composite transparent electrode such as a carbon nanotube thin film coupled with a metal.

Specifically, the laminate material that forms the anode 160 may include any one selected from the group consisting of magnesium, calcium, sodium, potassium, titanium, indium, yttrium, lithium, aluminum, silver, tin, lead, stainless steel, copper, tungsten, and silicon.

A hole acceptor and an electron acceptor are distributed in the photoactive layer. The photoactive layer is an auxiliary laminate section in which photons collide with electrons of the valence band existing in the electron acceptor of the photoactive layer under the action of light incident from an external light source so that electrons and holes can be separated.

The electron transport layer is a space in which the electrons separated at the photoactive layer move, and the hole transport layer is an auxiliary laminate section in which the holes separated at the photoactive layer move.

A metal oxide nano film layer 170 is an auxiliary laminate section which increases the speed of movement of electrons and holes, thereby enhancing the efficiency of the organic solar cell 100, and blocks oxygen and water penetrating from the outside so as to prevent the polymer contained in the photoactive layer 140 from being deteriorated by oxygen and water.

In addition to these, the auxiliary laminate section constituting the laminate section 20 may be other printed layers forming the organic solar cell.

When the laminate section 20 is a photoactive layer, the photoactive layer has a hole acceptor and an electron acceptor in mixture, and the hole acceptor is an organic semiconductor such as an electroconductive polymer or an organic low molecular weight semiconductor substance such as described above.

The electroconductive polymer may be any one selected from the group consisting of polythiophene, polyphenylene vinylene, polyfluorene, polypyrrole, copolymers thereof, and combinations thereof, and the organic low molecular weight semiconductor substance may be any one selected from the group consisting of pentacene, anthracene, tetracene, perylene, oligothiophene, derivatives thereof, and combinations thereof.

Furthermore, the hole acceptor may be preferably any one selected from the group consisting of poly-3-hexylthiophene [P3HT]), poly-3-octylthiophene [P3OT], poly(p-phenylene vinylene) [PPV], poly(9,9'-dioctylfluorene), poly(2-methoxy-5-(2-ethylhexyloxy)-1,4-phenylenevinylene [MEH-PPV], poly(2-methyl-5-(3',7'-dimethyloctyloxy))-1,4-phenylenevinylene [MDMOPPV], and combinations thereof.

The electron acceptor may be nanoparticles of any one selected from the group consisting of fullerene (C60), fullerene derivatives, CdS, CdSe, CdTe, ZnSe, and combinations thereof. The electron acceptor may be preferably any one selected from the group consisting of (6,6)-phenyl-C61-butyric acid methyl ester [PCBM], (6,6)-phenyl-C71-butyric acid methyl ester [C70-PCBM], (6,6)-thienyl-C61-butyric acid methyl ester [ThCBM], carbon nanotubes, and combinations thereof.

The photoactive layer is preferably composed of a mixture of P3HT as the hole acceptor and PCBM as the electron acceptor, and at this time, the mixing weight ratio of P3HT and PCBM may be 1:0.1 to 1:2.

The hole transport layer may contain any one hole transporting substance selected from the group consisting of poly (3,4-ethylenedioxythiophene) (PEDOT), poly(styrene sulfonate) (PSS), polyaniline, phthalocyanine, pentacene, polydiphenylacetylene, poly(t-butyl)diphenylacetylene, poly (trifluoromethyl)diphenylacetylene, copper phthalocyanine (Cu—PC), poly(bistrifluoromethyl)acetylene, polybis(t-butyldiphenyl)acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl) phenylacetylene, polynitrophenylacetylene, poly(trifluoromethyl)phenylacetylene, poly(trimethylsilyl)phenylacetylene, derivatives thereof, and combinations thereof, and preferably, a mixture of PEDOT and PSS may be used.

When the laminate section 20 is an electron transport layer, the laminate substance may contain any one electron transporting substance selected from the group consisting of lithium fluoride, calcium, lithium, titanium oxide, zinc oxide (ZnO), and combinations thereof.

When the laminate section 20 is a metal oxide nano film layer, the laminate substance may be a mixed solution containing a metal raw material substance and a basic additive in a solvent.

The metal raw material substance may be any one selected from the group consisting of metal chlorides, metal acetates, metal citrates, metal (meth)acrylates, metal bromides, metal cyanides, metal phosphates, metal sulfates, metal sulfides, and combinations thereof.

At this time, the metal may be any one metal selected from the group consisting of Ti, Zn, Sr, In, Ba, K, Nb, Fe, Ta, W, Sa, Bi, Ni, Cu, Mo, Ce, Pt, Ag, Rh, and combination thereof.

The basic additive may be any one selected from the group consisting of the group consisting of alcoholamines, aqueous hydrogen peroxide, ammonium hydroxide, sodium hydroxide, potassium hydroxide, rubidium hydroxide, cesium hydroxide, magnesium hydroxide, calcium hydroxide, and combinations thereof.

The solvent may be any one selected from the group consisting of chloroform, chlorobenzene, dichlorobenzene, trichlorobenzene, tetrahydrofuran (THF), dimethylformamide (DMF), dimethylacetamide (DMAC), dimethyl sulfoxide (DMSO), toluene, alcohol-based solvents, and combinations thereof.

When the laminate section 20 is the metal oxide nano film layer, the thickness of the laminate section 20 may be 5 nm to 500 nm, and preferably 10 nm to 200 nm. If the thickness of the laminate section 20 is within this range, the speed of movement of holes may be increased, while oxygen and water may be effectively prevented from penetrating from the outside and affecting the photoactive layer and the hole transport layer.

A printing unit 30 is formed to extend along the width direction of the substrate 10. The printing unit 30 applies a laminate material on the substrate 10 that moves in one direction to form a laminate section. The method by which the printing unit 30 forms the laminate section 20 may be any one of slot coating, slot die coating, multi coating, screen printing, inkjet printing, spray coating, dip coating, and blade coating. In addition to these, other known printing methods that are capable of forming an organic solar cell may be also be used as the method of forming the laminate section 20 on the substrate using the printing unit 30.

If it is needed to use different printing methods in accordance with various laminate materials, plural printing units 30 are disposed in the direction of movement of the substrate 10, and each of the printing units 30 may form a laminate section 20 on the substrate 10 by different printing methods.

Thereafter, in the step of removing the laminate section, a cleaning unit 40 moves in a reciprocating manner in the longitudinal direction of the substrate 10 as viewed in FIG. 1, and thereby removes a portion of the laminate section 20 from the substrate 10.

Specifically, the cleaning unit 40 is installed to be capable of moving up and down above the substrate 10 by means of a driving unit (not shown).

The driving unit may be, for example, an actuator. The configuration in which the cleaning unit 40 is moved up and down in a reciprocating manner above the substrate 10 by a driving unit such as an actuator is a well known technology, and thus, detailed description thereof will not be given here.

When the substrate 10 moves over a certain distance, the cleaning unit 40 moves down toward the substrate 10 and is brought into contact with the laminate section 20. At this time, one end of the cleaning unit 40 is brought into contact with the laminate section 20, and wipes off a portion of the laminate section 20 from the substrate 10.

The travel distance of the substrate 10 can be varied according to the size of the organic solar cell, and may range from 1 mm to 60 cm.

One end of the cleaning unit 40 is connected to a contact member 40a.

The contact member 40a may be formed from a fabric, sponge, cotton, rubber, or the like. The contact member 40a may also be formed of silicon or a plastic.

The contact member 40a is brought into contact with the laminate section 20 and wipes off the laminate section 20 from the substrate 10. Specifically, the cleaning unit 40 moves down so that the contact member 40a is brought into contact with the laminate section 20, and when the substrate 10 moves along the direction of movement of the substrate 10, the laminate section 20 that is in contact with the contact member 40a is removed from the substrate 10 by being absorbed by the contact member 40a or being transferred to the surface of the contact member 40a.

Alternatively, the contact member 40a may be formed from a solid material such as a metal.

In this case, the contact member 40a is brought into contact with the laminate section and may wipe off the laminate section from the substrate 10 by scraping off the laminate section 20 from the substrate.

Meanwhile, when the contact member 40a is made of a solid material such as a metal, protrusions and depressions may be formed at a surface of the contact member 40a. At this time, the cross-sections of the protrusions and depressions may be triangular, rectangular or circular in shape.

When protrusions and depressions are formed at the contact member 40a, the laminate section 20 can be easily removed from the substrate due to the protrusions and depressions.

At this time, the contact member 40a may be detachably connected to the cleaning unit 40.

The contact member 40a may be detached and reattached from the cleaning unit 40 by means of Velcro or the like.

Alternatively, the contact member 40a may be joined to the cleaning unit 40 by a sliding joint along the length direction of the cleaning unit 40. That is, the contact member 40a is connected to the cleaning unit 40 by a sliding joint, and thereafter, the contact member 40a may be separated from the cleaning unit 40 by causing the contact member 40a to slide in the opposite direction.

Alternatively, the contact member 40a may be adhered to the cleaning unit 40 by using an easily detachable adhesive, or the contact member 40a and the cleaning unit 40 may be connected by a clamp or the like.

Alternatively, hooks may be formed at either one of the contact member 40a and the cleaning unit 40, and grooves may be formed at the other of the contact member 40a and the cleaning unit 40, so that the contact member 40a can be detached and reattached from the cleaning unit 40 by inserting the hooks into the grooves or by separating them.

In addition to these, the contact member 40a may be detachably connected to the cleaning unit 40 by other known techniques.

In the case where the contact member 40a is detachably connected to the cleaning unit 40, when the contact member 40a is contaminated by the laminate section 20, only the contact member 40a may be separated from the cleaning unit 40, and the contact member 40a may be washed and reused, or the contact member 40a may be replaced and used.

However, if necessary, the contact member 40a may be connected to the cleaning unit 40 such that the contact member 40a is prevented from being disconnected from the cleaning unit 40.

At this time, the cleaning unit 40 may remove the laminate section 20 from the substrate 10 by moving in a reciprocating manner in a direction opposite to the direction of movement of the substrate 10 to clean. That is, the cleaning unit 40 may move in a transverse direction along the width direction of the substrate 10 to increase the friction force with the laminate section 20. Thereby, the cleaning unit 40 can remove the laminate section 20 for a predetermined distance along the width direction of the substrate 10.

Meanwhile, a receptacle unit 40b is formed in the cleaning unit 40 so that a solvent can be injected into the receiving unit 40b.

When the receiving unit 40b is formed in the cleaning unit 40, the step of removing the laminate section 20 may include the steps of injecting a solvent that dissolves the laminate material in the cleaning unit 40, lowering the cleaning unit 40 toward the substrate, and bringing one end of the cleaning unit 40 into contact with the laminate section 20 to wipe off the part of the laminate section 20 from the substrate 10.

The solvent dissolves the laminate section 20 so as to facilitate removal of the laminate section 20 from the substrate 10.

The solvent may be, for example, water ($H_2O$), but the component of the solvent may vary with the laminate material constituting the laminate section 20 that will be removed. That is, the solvent may be any one selected from the group consisting of ethanol, methanol, propanol, isopropanol, butanol, acetone, pentane, toluene, benzene, diethyl ether, methyl butyl ether, N-methylpyrrolidone (NMP), tetrahydrofuran (THF), dimethylformamide (DMF), dimethylacetamide (DMAC), dimethyl sulfoxide (DMSO), carbon tetrachloride, dichloromethane, dichloroethane, trichloroethylene, chloroform, chlorobenzene, dichlorobenzene, trichlorobenzene, cyclohexane, cyclopentanone, cyclohexanone, dioxane, terpineol, and combinations thereof.

At this time, the contact member 40a may be detachably connected to an end of the cleaning unit 40. That is, when the solvent is absorbed by the contact member 40a, and the contact member 40a is brought into contact with the laminate section 20, the laminate section 20 is dissolved by the solvent that has been absorbed by the contact member 40a, and the contact member 40a wipes off the dissolved laminate section 20 from the substrate to thereby leave the laminate section 20 and a removed section 21.

Particularly, it is preferable that the contact member be made of a material having high chemical resistance and durability so that the contact member 40a is not be deformed by the chemical reaction between the solvent and the laminate section 20.

The cleaning unit 40 is formed to extend in the width direction that intersects the direction of movement of the substrate 10. The lowered cleaning unit 40 is brought into contact with the laminate section 20 and forms a removed section 21 between a laminate section 20 and another laminate section 20. Therefore, as shown in FIG. 3, laminate sections 20 are formed to be separated apart from each other on the substrate 10.

The removed section 21 removed by the cleaning unit 40 may take a role of electrically connecting an electrode of a cell with an external connection electrode or may be utilized as an isolation region of a modulation circuit, when a solar cell module is formed by connecting cells later.

Figure 4:
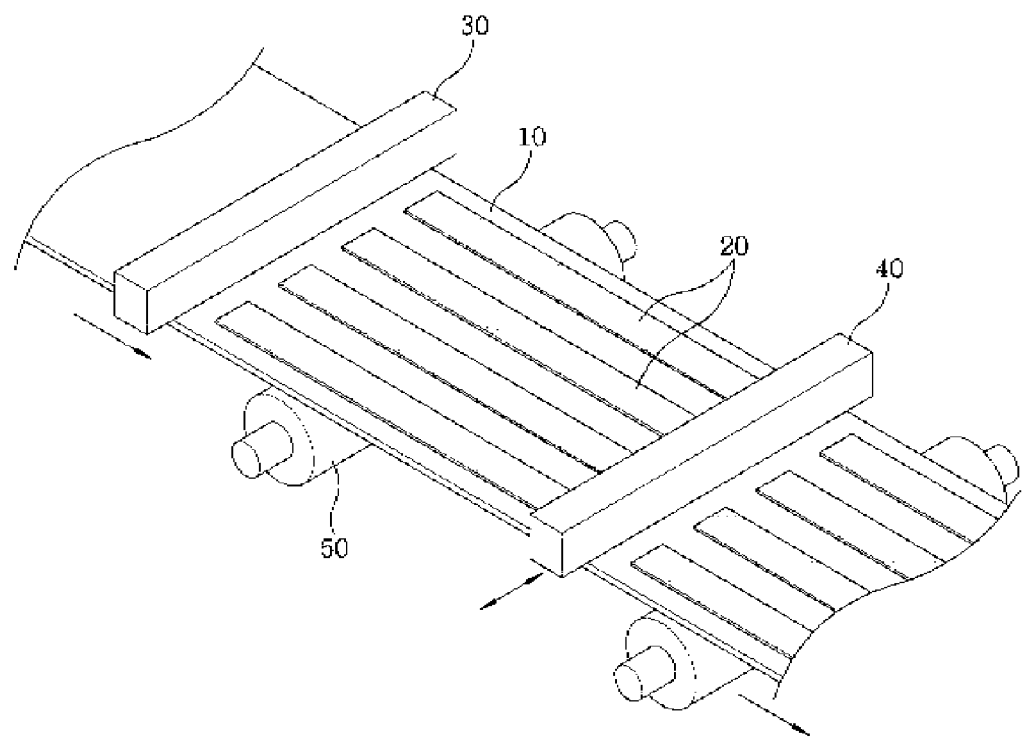
FIG. 4 is a schematic diagram illustrating the step of removing the laminate section according to another exemplary embodiment of the present invention.

FIG. 4 depicts a step of removing the laminate section according to another exemplary embodiment of the present invention.

The step of removing the laminate section 20 according to another exemplary embodiment includes the steps of lowering the cleaning unit toward the substrate to be in contact with the laminate section; wiping off the laminate section from the substrate by causing the cleaning unit to move forward and backward in a reciprocating manner in the width direction of the substrate; and lifting the cleaning unit above the substrate.

According to another exemplary embodiment, after the cleaning unit 40 is lowered to be in contact with the laminate section 20, the cleaning unit 40 repeats a forward movement and a backward movement along the width direction of the substrate 10, and thereby removes the laminate section 20 from the substrate 10.

In this case, since the cleaning unit 40 moves in a reciprocating manner on the surface of the substrate 10, removal of the laminate section 20 can be easily achieved as compared with the exemplary embodiment.

At this time, when the cleaning unit 40 is brought into contact with the laminate section 20, the conveyor roller may be temporarily stopped. That is, a sensor (not shown) is mounted in the cleaning unit 40 so that when the cleaning unit 40 is brought into contact with the laminate section 20, the sensor transmits a signal to the driving unit that drives the conveyor roller, and the conveyor roller is temporarily stopped. Thereafter, when the cleaning unit 40 removes the laminate section 20 from the substrate 10 and forms a removed section, the cleaning unit 40 is lifted up. When the cleaning unit 40 is not brought into contact with the laminate section 20, the sensor transmits a signal to the driving unit, and the conveyor roller operates again so that the substrate moves forward in one direction.

However, if the speed of the substrate 10 is slow, and the cleaning unit 40 can remove the laminate section 20 without stopping the substrate 10, or if the area to be removed from the laminate section 20 is large, the cleaning unit 40 may repeat forward and backward movements in the width direction of the substrate 10 during the movement of the substrate 10 and remove the laminate section 20 from the substrate 10, without stopping the substrate 10.

Alternatively, although not shown in the diagram, the cleaning unit 40 may have a roll shape formed to extent along the width direction of the substrate, and the step of removing a portion of the laminate section may include the steps of lowering the cleaning unit toward the substrate to bring the cleaning unit into contact with the laminate section; wiping off the laminate section from the substrate by causing the cleaning unit to rotate about the central axis along the length direction of the cleaning unit; and lifting the cleaning unit.

That is, the cleaning unit 40 is lowered toward the substrate 10 to be brought into contact with the laminate section 20, and the cleaning unit 40 rotates about an axis along the length direction of the cleaning unit 40 and removes the laminate section 20 from the substrate 10. When a portion of the laminate section 20 is removed, and a removed section is formed, the cleaning unit 40 is lifted above the substrate 10, and the substrate 10 on which the laminate section 20 is printed continuously moves along the process direction.

Meanwhile, in the step of printing the laminate section, plural auxiliary laminate sections having different properties may be sequentially laminated on the substrate 10 to form a laminate section 20.

That is, a metal oxide nano film layer and a hole transport layer may be sequentially laminated so as to form a laminate section 20, and subsequently, the laminate section 20 may be removed by using the cleaning unit 40. Thereafter, a photoactive layer may be printed on the substrate 10 and removed, and then an electron transport layer may be printed on the substrate 10.

Alternatively, a process of printing one auxiliary laminate section on the substrate 10, removing this auxiliary laminate section from the substrate 10, subsequently printing another auxiliary laminate section on the substrate, and removing this auxiliary laminate section from the substrate, may be repeated.

That is, when the laminate section 20 is composed of plural auxiliary laminate sections having different properties, the laminate section 20 may be formed by repeating a process of printing and removing one auxiliary laminate section, or by repeating a process of printing and removing plural auxiliary laminate sections, and then printing and removing another auxiliary laminate section.

When plural auxiliary laminate sections are sequentially printed on the substrate and then removed at once, it is preferable that the laminate materials that constitute the auxiliary laminate sections to be removed simultaneously be dissolvable by the same solvent.

That is, auxiliary laminate sections that can be easily dissolved by the same solvent may be sequentially printed and then removed by a single removal process.

However, when the auxiliary laminate section is thick, it is difficult for the cleaning unit to be brought into contact with and remove the auxiliary laminate section. In this case, it is preferable to form the laminate section by repeating a process of printing one auxiliary laminate section, removing the one auxiliary laminate section, and then printing another auxiliary laminate section.

When the laminate section 20 is formed on the substrate 10 using the printing unit 30, and the cleaning unit 40 is lowered to remove the laminate section 20 in the width direction that intersects the direction of movement of the substrate 10 from the substrate as described above, at least one removed section 21 is formed as shown in FIG. 3, and a substrate 10 on which a laminate section 20 having a portion thereof removed in the width direction that intersects the length direction of the substrate 10 is printed, is manufactured.

Figure 5:
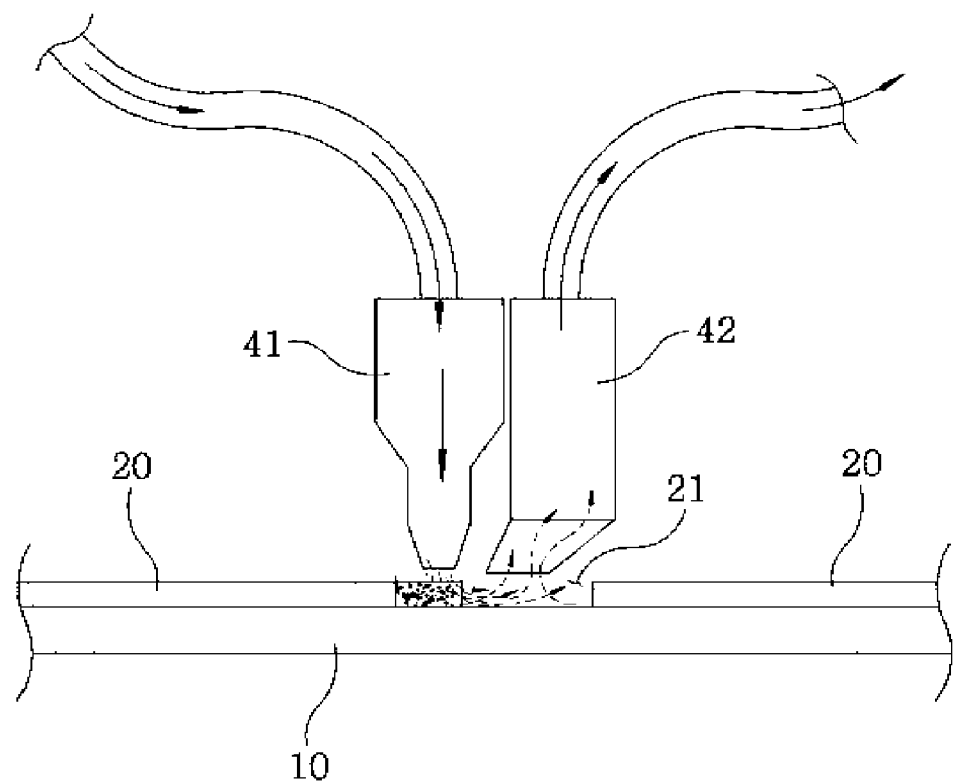
FIG. 5 is a schematic diagram illustrating the step of removing the laminate section according still another exemplary embodiment of the present invention.

FIG. 5 is a schematic diagram showing a step of removing the laminate section according to another exemplary embodiment of the present invention.

The step of removing the laminate section according to another exemplary embodiment of the present invention includes the steps of spraying a solvent to the substrate 10 through a discharging unit 41, and suctioning the laminate section 20 through a suctioning unit 42.

The discharging unit 41 is mounted above the substrate 10 apart from the printing unit 30. A solvent is injected into the discharging unit 41 and sprays the solvent to the laminate section 20.

The solvent may have different properties in accordance with the laminate material.

When the laminate section 20 is composed of plural auxiliary laminate sections, and the auxiliary laminate sections respectively have different properties, plural kinds of solvents may be injected into the discharging unit 41 in accordance with the auxiliary laminate sections.

At this time, the interior of the discharging unit 41 may be compartmentalized by a dividing unit (not shown) so that the respective solvents are not mixed with each other. The dividing unit may be a partition wall provided inside the discharging unit 41 along the length direction of the discharging unit 41.

That is, in the case where plural solvents need to be injected into the discharging unit 41 and separately sprayed to the substrate 10, since the discharging unit 41 is compartmentalized by the dividing unit, different solvents can be stored in the discharging unit 41.

When a portion of the laminate section 20 is dissolved by the solvent discharged from the discharging unit 41, the dissolved laminate section is later absorbed by a suctioning unit 42.

The suctioning unit 42 is connected to an external tank. The suctioning unit 42 suctions the laminate section 20 by means of the pressure difference between the internal pressure of the suctioning unit 42 and the external pressure. Alternatively, a pump may be connected to the suctioning unit 42, or a suctioning fan may be installed in the suctioning unit 42 so that the suctioning unit 42 can suction the laminate section 20.

In the step of removing the laminate section 20 according to another exemplary embodiment, a solvent is sprayed from the discharging unit 41 toward the laminate section 20, and when the laminate section 20 is dissolved by the solvent, the dissolved laminate section 20 is suctioned by the suctioning unit 42. Thus, a portion of the laminate section 20 is removed from the substrate 10.

At this time, the discharging unit 41 and the suctioning unit 42 can be moved up and down above the substrate 10 by the driving unit, as in the case of the cleaning unit 40 according to the exemplary embodiment.

In this case, the distance between the discharging unit 41, the suctioning unit 42 and the substrate 10 can be adjusted, and thereby, the laminate section 20 that has been dissolved by the solvent can be easily suctioned by the suctioning unit 42.

Meanwhile, when the laminate section is removed from the substrate by dissolving the laminate section in the solvent injected into the cleaning unit 40, some auxiliary laminate sections among the plural auxiliary laminate sections can be selectively removed depending on the properties of the solvent.

For example, when the laminate section 20 includes a PEDOT-PSS layer and an active layer, that is, two auxiliary laminate sections having different properties, are sequentially laminated, and water is used as the solvent, the PEDOT-PSS layer can be dissolved by water, but the active layer is not dissolved. Therefore, selective removal is made possible.

Therefore, when the laminate section 20 is removed from the substrate 10 by a method in which the cleaning unit 40 is not in contact with the laminate section 20, the solvent is sprayed to the laminate section 20, and the laminate section 20 is dissolved by the solvent and absorbed, in the case where the laminate section includes plural auxiliary laminate sections having different properties as described above, the auxiliary laminate sections can be selectively removed by the solvent.

While this invention has been described in connection with what is presently considered to be practical exemplary embodiments, it is to be understood that the scope of the present invention is not limited to the disclosed embodiments, but, on the contrary, is intended to cover various modifications and equivalent arrangements included within the spirit and scope of the appended claims.

The invention claimed is:

1. A method for manufacturing an organic solar cell, the method comprising:
   printing a laminate section constituting the organic solar cell on a substrate that is moved by a conveyor roller, and
   removing a portion of the laminate section from the substrate by moving a cleaning unit up and down in a reciprocating manner, above the substrate on which the laminate section is printed.

2. The method according to claim 1, wherein the step of removing the laminate section removes the laminate section from the substrate in the width direction that intersects the direction of movement of the substrate.

3. The method according to claim 1, wherein a contact member is detachably connected to an end of the cleaning unit, and
   the contact member wipes off the laminate section from the substrate while being in contact with the laminate section.

4. The method according to claim 3, wherein the contact member is joined to the cleaning unit through a sliding joint along the length direction of the cleaning unit.

5. The method according to claim 1, wherein protrusions and depressions are formed at one surface of the cleaning unit.

6. The method according to claim 1, wherein the step of removing the laminate section comprises:
   injecting a solvent into the cleaning unit;
   moving the cleaning unit toward the substrate; and
   bringing one end of the cleaning unit into contact with the laminate section to wipe off the laminate section from the substrate.

7. The method according to claim 1, wherein the step of removing a portion of the laminate section comprises:
   lowering the cleaning unit toward the substrate to be in contact with the laminate section;
   wiping off the laminate section from the substrate by causing the cleaning unit to repeat forward and backward movement in the width direction of the substrate; and
   lifting the cleaning unit above the substrate.

8. The method according to claim 7, wherein the movement of the substrate is stopped when the cleaning unit is brought into contact with the laminate section, and
   the substrate is moved by the conveyor roller when the cleaning unit is lifted up.

9. The method according to claim 1, wherein the cleaning unit has a roll shape formed to extend along the width direction of the substrate, and wherein the step of removing a portion of the laminate section comprises
   lowering the cleaning unit toward the substrate to be in contact with the laminate section,
   wiping off the laminate section from the substrate by causing the cleaning unit to rotate about the central axis along the length direction of the cleaning unit, and
   lifting the cleaning unit.

10. The method according to claim 1, wherein in the step of printing the laminate section, plural auxiliary laminate sections having different components are sequentially printed on the substrate.

11. A method for manufacturing an organic solar cell, the method comprising:
 printing a laminate section constituting the organic solar cell on a substrate that is moved by a conveyor roller;
 spraying a solvent toward the laminate section through a discharging unit; and
 suctioning the laminate section dissolved by the solvent, through a suctioning unit.

12. The method according to claim 11, wherein the method further comprises lowering the discharging unit and the suctioning unit toward the substrate after the step of printing the laminate section, and the method comprises lifting the discharging unit and the suctioning unit away from the substrate after the step of suctioning the laminate section.

* * * * *